US007733633B2

(12) United States Patent
Johnson et al.

(10) Patent No.: US 7,733,633 B2
(45) Date of Patent: Jun. 8, 2010

(54) VIDEO DISPLAY UNIT SUPPORT BRACKET

(75) Inventors: Julian Eric Johnson, Springboro, OH (US); Ron Knollman, Cincinnati, OH (US); Herb Amster, Delray Beach, FL (US); Tim Beatty, Boca Raton, FL (US)

(73) Assignees: PDI Communication Systems, Inc., Springboro, OH (US); TVR Communications LLC, Woodside, NY (US)

( * ) Notice: Subject to any disclaimer, the term of this patent is extended or adjusted under 35 U.S.C. 154(b) by 1077 days.

(21) Appl. No.: 11/365,245

(22) Filed: Mar. 1, 2006

(65) Prior Publication Data
US 2007/0215373 A1  Sep. 20, 2007

(51) Int. Cl.
G06F 1/16 (2006.01)
(52) U.S. Cl. .............................. 361/679.02; 248/278.1
(58) Field of Classification Search .................. 174/66; 361/749–751; D14/451; 248/278.1, 276.1, 248/679.21
See application file for complete search history.

(56) References Cited

U.S. PATENT DOCUMENTS

| 5,611,513 | A  | * | 3/1997  | Rosen .................... 248/222.11 |
| 5,996,954 | A  | * | 12/1999 | Rosen et al. ............. 248/278.1 |
| 6,639,789 | B2 | * | 10/2003 | Beger ........................... 606/46 |
| 6,672,553 | B1 | * | 1/2004  | Lin ........................... 248/276.1 |
| 6,695,274 | B1 | * | 2/2004  | Chiu ........................... 248/371 |
| 7,014,154 | B2 | * | 3/2006  | Jeong et al. .................. 248/157 |
| 7,042,714 | B2 | * | 5/2006  | Hillman et al. ........ 361/679.21 |
| 7,061,754 | B2 | * | 6/2006  | Moscovitch ........... 361/679.21 |
| 7,145,767 | B2 | * | 12/2006 | Mache et al. .......... 361/679.21 |
| 2005/0002159 | A1 | * | 1/2005 | Jeong ......................... 361/683 |
| 2005/0152109 | A1 | * | 7/2005 | Choi et al. .................. 361/683 |
| 2006/0018092 | A1 | * | 1/2006 | Nagano ....................... 361/687 |
| 2006/0176655 | A1 | * | 8/2006 | Hillman et al. ............. 361/683 |
| 2006/0203436 | A1 | * | 9/2006 | Hwang et al. ............... 361/679 |
| 2007/0097617 | A1 | * | 5/2007 | Searby et al. ............... 361/686 |
| 2007/0097618 | A1 | * | 5/2007 | Searby et al. ............... 361/686 |

* cited by examiner

Primary Examiner—Lisa Lea-Edmonds
(74) Attorney, Agent, or Firm—Harness, Dickey & Pierce, P.L.C.

(57) ABSTRACT

A video display unit support bracket (100) that facilitates greater integration of TV, internet, gaming, and computer peripheral devices. The bracket (100) can include a rigid casing (105) defining a first outer shell (205). An engagement structure (110) can be disposed on a portion of the rigid casing (105). The engagement structure (110) includes one or more receivers (220) that are configured for rotatably securing a proximal end (121) of a video display unit support arm (120) to the rigid casing (105). The rigid casing (105) can enclose a first internal cavity (306), which, in turn, can enclose one or signal processing circuits (300) selected from the group consisting of an RF modem (310), a multiplexing device (305), and a control signal interface circuit (315).

20 Claims, 4 Drawing Sheets

VIDEO DISPLAY UNIT SUPPORT BRACKET

BACKGROUND OF THE INVENTION

1. Statement of the Technical Field

The inventive arrangements relate generally to support brackets, and more particularly to a video display unit support bracket that facilitates greater integration of TV, internet, gaming, and computer peripheral devices.

2. Description of the Related Art

Given the inherent discomfort and inconvenience of being admitted to a hospital as a patient, medical institutions have sought to raise the level of comfort in modern day hospital patient rooms. By ameliorating the living conditions of a patient, it has been shown that patient recovery times can be shortened. Moreover, hospitals have recognized the difficulties that patients endure when making the transition from a flexible home/work setting to a more restrictive hospital setting. For these reasons, several technological amenities have been added to a patient's room to improve the quality of a patient's stay.

One of these amenities has included the incorporation of a video monitor within a hospital room. A typical patient room video monitor is attached to an adjustable arm, which is in turn mounted to a wall bracket. The adjustable arm-bracket configuration facilitates the frequent re-positioning of the video monitor while occupying less of a patient room's limited ground space. Video monitors advantageously offer patients several possibilities for multimedia uses. For example, video monitors can be used for the transmission of cable television feeds. In addition, with the rising popularity of the Internet, patients can access their email, web browse, or perform basic personal computing from the convenience of their own hospital bed. Similarly, the video monitor can also serve as medium with which to play video games. All these technologies provide entertainment and productivity solutions for thousands of patients.

However, several problems currently exist with the installation of these technological amenities in a patient's room. In order to provide various television, gaming, and computing functionalities, separate enclosures have had to be provided for housing the various electronic devices. As a result of these separate enclosures, additional cabling has been needed be run between the various electronics and the video monitor. The need for additional cabling can create a potential safety hazard since a patient, visitor, or medical worker may run the risk of tripping over these various cables. Aside from additional cabling, this practice has also required the installation of additional power outlets to drive the various electronic components. Another problem with current patient rooms is the inability to remotely identify the various electronic components from a centralized server.

For the foregoing reasons, there is a need for an improved video display support bracket that can integrate peripheral devices such as a video monitor, television controls, computer keyboard, mouse, and game controllers. Moreover, the improved bracket should reduce the hazard, need, and expense in installing additional cabling and power outlets for a patient's room.

SUMMARY OF THE INVENTION

The invention is directed to a video display support bracket. The video display support bracket can include a rigid casing defining a first outer shell. An engagement structure can be disposed on a portion of the rigid casing. The engagement structure can include one or more receivers. The receiver(s) can be configured for rotatably securing a proximal end of a video display unit support arm to the rigid casing. The rigid casing can partially enclose a first internal cavity. One or more signal processing circuits can be disposed within the first internal cavity. The signal processing circuits can include an RF modem, a multiplexing device, and a control signal interface circuit.

The receiver can be formed as an elongated aperture that is sized and shaped for receiving a pin disposed on an end of the support arm proximal to the rigid casing. The elongated aperture can contain a bushing configured for rotation of the pin. Alternatively, the receiver can include an elongated pin that is sized and shaped to engage an aperture disposed on an end of the support arm proximal to the rigid casing.

The invention can further include a video display unit support arm having a coupler disposed on the proximal end. The coupler can be sized and shaped to engage the receiver. The coupler and receiver can form a rotatable coupling between the video display unit support arm and the video display bracket.

The multiplexing device can further include a means for multiplexing a power supply voltage and an RF signal containing video display data for the video display unit. The multiplexing device can further include a voltage regulation circuit. The voltage regulation circuit can provide a regulated voltage output responsive to the power supply voltage. The video display unit support bracket can further include an electronic identification device disposed within the video display unit bracket. The electronic identification device can be operatively connected to the RF modem through the control signal interface board. The control signal interface board can include a plurality of peripheral devices. The peripheral devices can include user interface control devices selected from the group consisting of a video display unit control, a keyboard control, a mouse control, and a game paddle control.

DETAILED DESCRIPTION OF THE PREFERRED EMBODIMENTS

Figure 1:
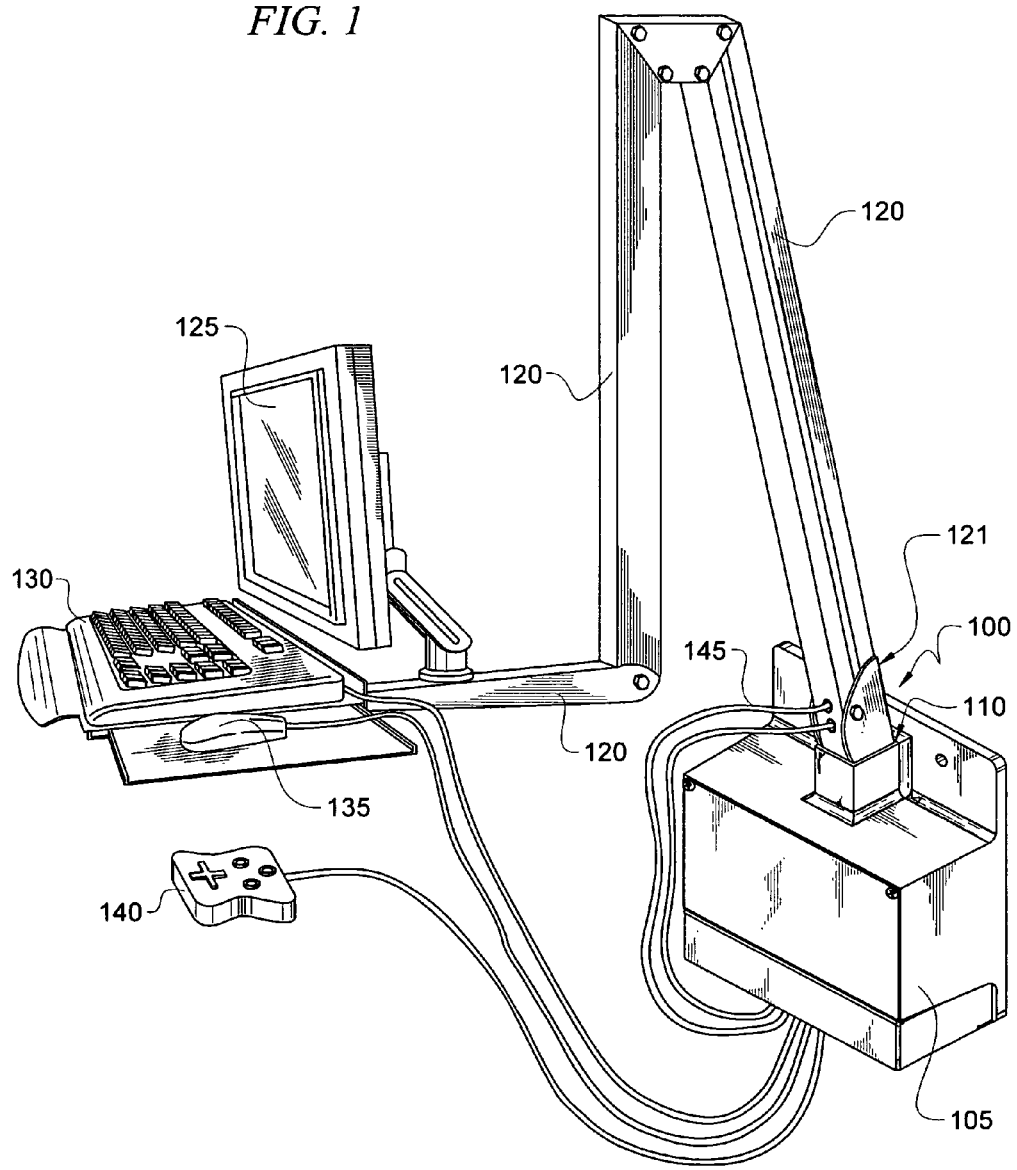
FIG. 1 shows a perspective view of a video display unit support bracket supporting a video display unit support arm.

The present invention concerns an improved video display unit support bracket. Referring to FIG. 1, one embodiment of the video display unit support bracket 100 is illustrated. The support bracket 100 includes a rigid casing 105 and an engagement structure 110 for rotatably coupling a video display unit support arm 120 with the support bracket 100. The support bracket 100 can be used to support the weight of a video display unit support arm 120. The support arm 120, in turn, can be used to position and support the weight of a video display monitor 125. The support arm 120 can also support various other peripheral devices such as a keyboard 130, mouse 135, game paddle 140, and video display unit control 145.

Figure 2:
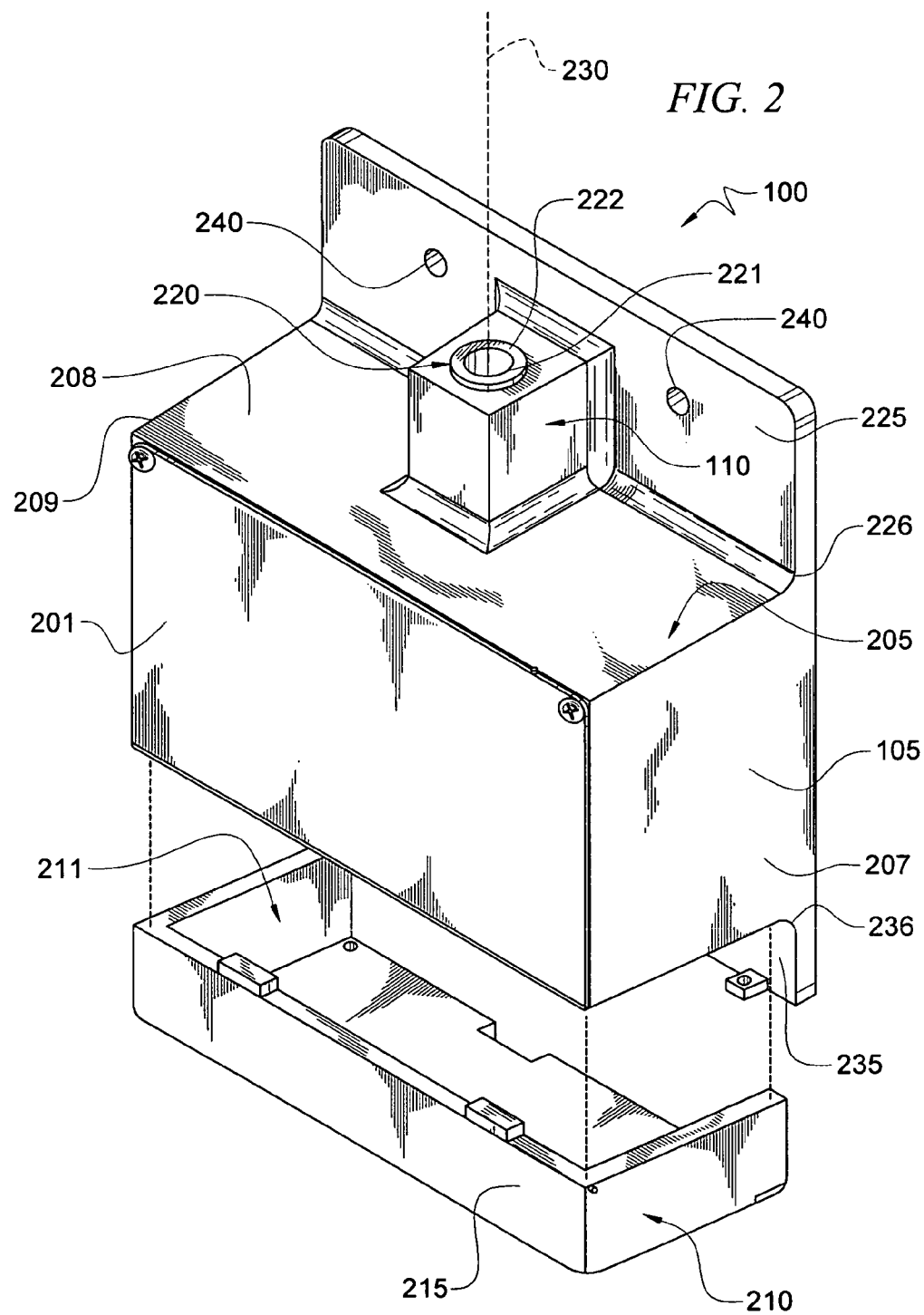
FIG. 2 shows a partial exploded view of the video display unit support bracket in FIG. 1.

Referring now to FIG. 2, it can be observed that the video display bracket 100 can include a rigid casing 105 and a casing cover 201 defining a first outer shell 205. The rigid casing 105 can be comprised of side walls 207, 209 and a top wall 208. The rigid casing 105 can also include a first internal cavity that is partially enclosed therein. Although the rigid casing 105 shown in FIG. 2 can be generally parallelepiped in shape, the invention is not limited in this regard.

The rigid casing 105 can include a top flange plate 225 extending from a top, rear edge 226 of the rigid casing 105 in a direction along a longitudinal axis 225. The rigid casing 105 can further include a bottom flange plate 235 extending from a bottom, rear edge 236 of the rigid casing 105 in a direction along a longitudinal axis 230. The top and bottom flange plates 225, 235 can have mounting holes 240 through which mounting screws (not shown) can pass to facilitate the mounting of the support bracket 100 onto an anchoring surface, such as a wall. It can be appreciated that the invention is not limited in this regard and any suitable mounting mechanism can be used to secure the support bracket 100 onto the anchoring surface.

The bracket 100 can further include a rigid cover 210 defining a second outer shell 215. The rigid cover 210 can be releasably secured to the rigid casing 105. According to the embodiment shown in FIG. 2, the rigid cover 310 can be secured to the rigid casing 105 using screws (not shown). However, the invention is not limited in this regard and other types of securing mechanisms can be employed. Moreover, the rigid cover 210 can partially enclose a second internal cavity 211. While the rigid cover 210 can be generally parallelepiped in shape, the invention is not limited in this regard. The rigid casing 105 and rigid cover 210 can be formed of a heavy duty cast aluminum material. Other materials that can be used to form the rigid casing 105 and rigid cover 210 include, but are not limited to, rigid polymer materials, composite structures, iron, nickel, copper, and alloys thereof such as stainless steel and brass.

According to one embodiment of the support bracket 100 shown in FIGS. 1 and 2, an engagement structure 110 can be disposed on a portion of the rigid casing 105. The engagement structure 110 can include one or more receivers 220. The receiver(s) 220 can be configured for securing a proximal end 121 of a video display unit support arm 120 to the rigid casing 105. For example, the receiver 220 can be defined by an elongated aperture 221. The elongated aperture can include a pivot bushing 222 that is disposed through an aperture in the rigid casing. Examples of pivot bushings include, but are not limited to, permanently lubricated Oillite™ pivot bushings for maintenance free operation. Standard bushing sizes used to engage the proximal end 121 of a video display support arm 120 can be ⅝ inch and ½ inch sizes. However, the invention is not limited in this regard. The elongated aperture 221 can be sized and shaped for receiving a pin (not shown) disposed on the end 121 of the support arm 121 that is proximal to the rigid casing 105.

It is important to note that the engagement structure 110, as described herein, is merely one possible embodiment and the invention is not limited in this regard. According to another embodiment of the invention, the receiver 220 can be defined by an elongated pin that is sized and shaped to engage a coupler defined by an aperture disposed on the end 121 of the support arm 120 that is proximal to the rigid casing 105. The elongated pin and aperture can be configured to form a rotatable coupling.

Figure 3:
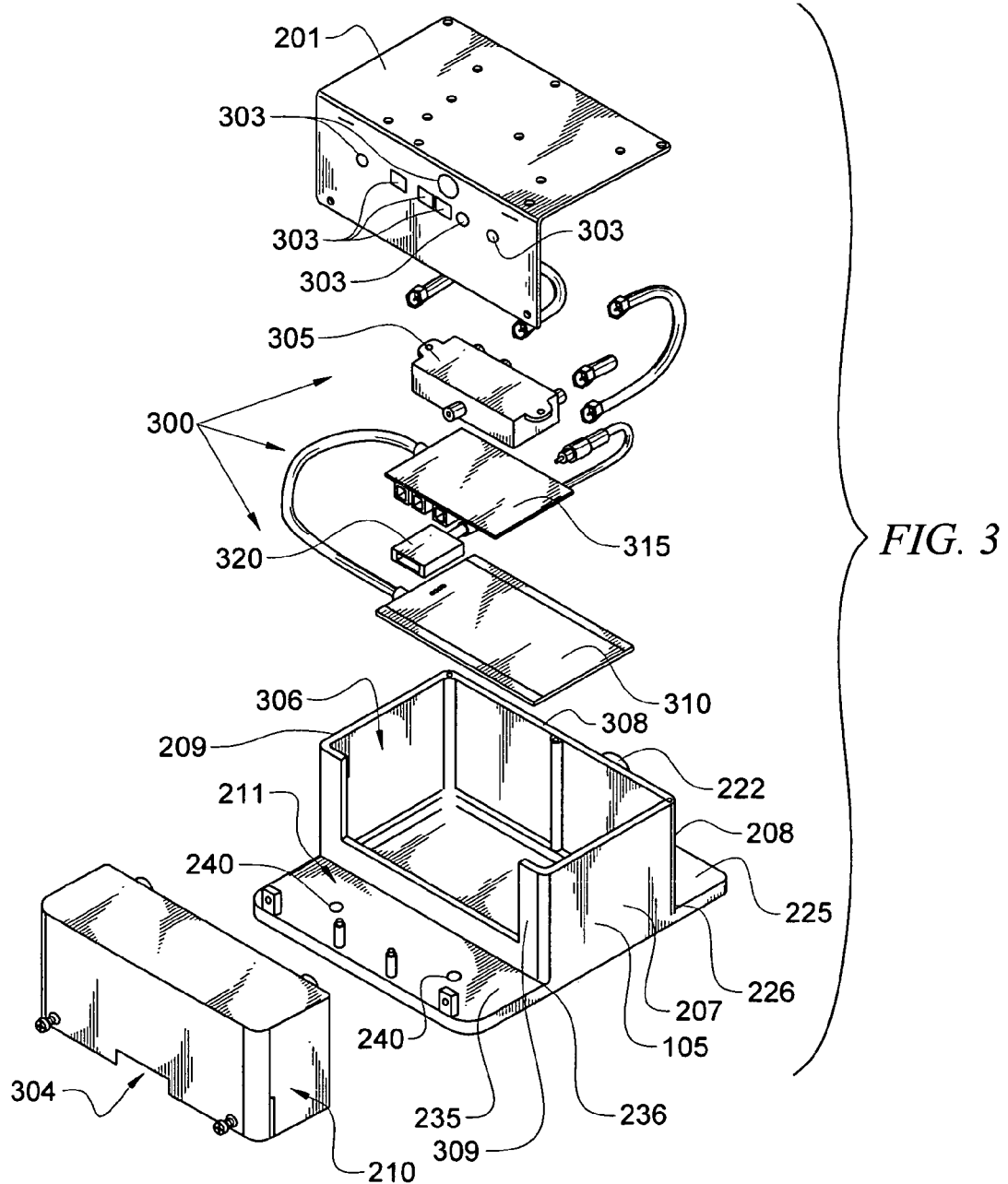
FIG. 3 shows an exploded view of the video display unit support bracket in FIG. 2.

Referring to FIG. 3, it can be observed that the first internal cavity 306 can be sized and shaped to partially enclose signal processing circuitry 300 such as a multiplexing device 305, an RF modem 310, and a control signal interface circuit 315. The second internal cavity 211 can be sized and shaped such that one or more cables and an electronic identification device 320 can be disposed therein. Cables that extend out of the rigid casing 105 can be disposed through a cable aperture 304. When the casing cover 201 and rigid cover 210 are respectively attached to the rigid casing 105, both the first internal cavity 306 and the second internal cavity 211 can be generally parallelepiped in shape. However, the invention is not limited in this regard.

The casing cover 201 is sized and shaped to partially enclose the first internal cavity 306. For example, a front portion 301 and a bottom portion 302 of the casing cover 201 can be respectively mated with a front surface 308 and a bottom surface 309 of the rigid casing 105. The bottom portion 302 of the casing cover 201 can partially divide the first internal cavity 306 from the second internal cavity 211. The bottom portion 302 can include one or more connector openings 303. The connector openings 303 are sized and shaped to allow electrical connectors to be disposed therein.

The multiplexing device 305 can be configured to receive and demultiplex a power supply voltage and an RF signal, which are transmitted via a coaxial cable input signal. According to one embodiment of the invention, the multiplexing device 305 can further include a voltage regulation circuit, which can provide a regulated voltage output that is responsive to the power supply voltage. For example, the power supply voltage range that can be supplied to the multiplexing device 305 is about 18-40 VDC, and the regulated output voltage can be in the range of about 12-40 VDC. Still, the invention is not limited in this regard.

Figure 4:
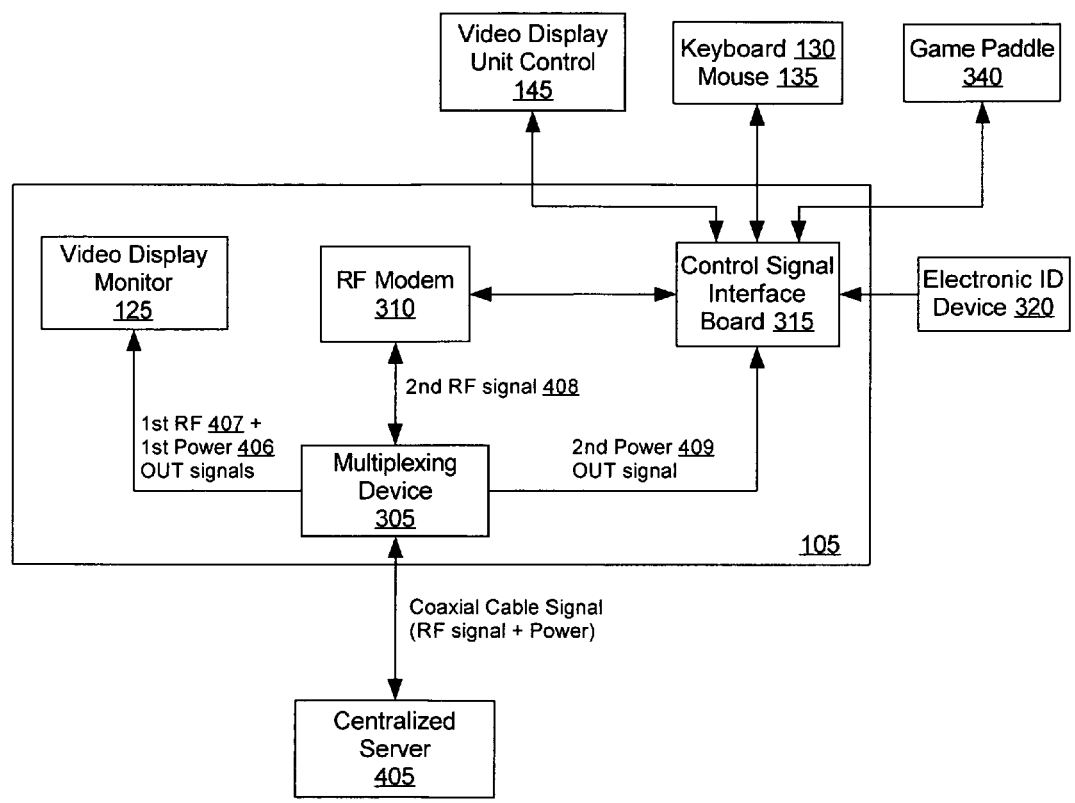
FIG. 4 shows a block diagram of a signal processing circuit that is useful for understanding the invention.

According to an embodiment of the invention shown in FIG. 4, the multiplexing device 305 can further sub-divide the coaxial cable input signal into: a first regulated power 406 and first RF pass thru signal 407, a second RF pass thru signal 408, and a second regulated power signal 409. The first regulated power signal 406 and first RF pass thru signal 407 can be transmitted to the video display monitor 125. The second RF pass thru signal 408 can be transmitted to/from the RF modem 310. The second regulated power signal 409 can be used to power a control signal interface board 315. The control signal interface board can in turn provide regulated power to one or more peripheral devices, including the RF modem 310. The second power signal 409 can include a voltage of 12 VDC. However, the invention is not limited in this regard.

The RF modem 310 can convert a digital signal into a form suitable for transmission over an analog communications link. For example, a baseband digital signal can be modulated onto an RF signal for transmission. In particular, the RF modem 310 can communicate data with a centralized server 405. Typical RF bandwidth that can be used to transmit data is about 5-1000 MHz, but the invention is not limited in this regard.

The RF modem 310 can be operatively connected to control signal interface board 315. For example, data and power can be communicated between RF modem 310 and control signal interface board 315 via an electrical connector. For example, such an electrical connector can include, but is not limited to a DB-9 serial electrical connector cable. However, the invention is not limited in this regard and other types of data connection cables can be used to transfer data. The control signal interface board 315 can include one or more peripheral device interfaces for communicating with one or more peripheral devices. The peripheral devices can include a video display unit control 145, keyboard control 130, mouse control 135, and game paddle control 140. These devices constitute merely one embodiment of the invention and other types of peripheral control devices can be used.

The electronic identification device 320 can be operatively connected to the RF modem 310 through the control signal interface board 315. The electronic identification device 320 can be configured to communicate an RFID signal to the RF modem 310, which transmits the RFID information to the centralized server. According to one embodiment of the invention, the RFID signal can be used to transmit room ID information, such that the centralized server can identify, monitor, and control the particular electronic devices located with a particular patient's room.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims. Accordingly, reference should be made to the following claims, rather than to the foregoing specification, as indicating the scope of the invention.

What is claimed is:

1. A video display unit support bracket comprising:
    a rigid casing defining a first outer shell;
    an engagement structure disposed on a portion of said rigid casing, said engagement structure comprising at least one receiver configured for rotatably securing a proximal end of a video display unit support arm to said rigid casing;
    a first internal cavity at least partially enclosed by said rigid casing; and
    a multiplexing device disposed within said first internal cavity;
    wherein said multiplexing device further comprises means for multiplexing a power supply voltage and an RF signal containing video display data for said video display unit.

2. The video display unit support bracket according to claim 1, wherein said multiplexing device further contains a voltage regulation circuit, said voltage regulation circuit providing a regulated voltage output responsive to said power supply voltage.

3. The video display unit support bracket of claim 1, further comprising an electronic identification device connected to an RF modem through a control signal interface board.

4. The video display unit support bracket of claim 1, further comprising a control signal interface board that includes a plurality of peripheral device interfaces for communicating with a plurality of peripheral devices.

5. The video display unit support bracket of claim 4, wherein the plurality of peripheral devices includes at least one of the following: a video display unit control, a keyboard control, a mouse control, and a game paddle control.

6. The video display unit support bracket of claim 1, wherein said receiver includes an elongated pin sized and shaped to engage an aperture disposed on an end of said support arm proximal to said rigid casing.

7. A video display unit support bracket comprising:
    a rigid casing defining a first outer shell;
    an engagement structure disposed on a portion of said rigid casing, said engagement structure comprising at least one receiver configured for rotatably securing a proximal end of a video display unit support arm to said rigid casing;
    a first internal cavity at least partially enclosed by said rigid casing;
    an RF modem disposed within said first internal cavity; and
    an electronic identification device disposed within said video display unit support bracket.

8. The video display unit support bracket according to claim 7, wherein said receiver is comprised of an elongated aperture sized and shaped for receiving a pin disposed on an end of said support arm proximal to said rigid casing.

9. The video display unit support bracket according to claim 8, wherein said elongated aperture contains a bushing configured for rotation of said pin.

10. The video display unit support bracket according to claim 7, wherein said receiver is comprised of an elongated pin sized and shaped to engage an aperture disposed on an end of said support arm proximal to said rigid casing.

11. The video display unit support bracket according to claim 7, further comprising a video display unit support arm having a coupler disposed on said proximal end, said coupler sized and shaped to engage said receiver, said coupler and said receiver forming a rotatable coupling between said video display unit support arm and said video display unit support bracket.

12. The video display unit bracket according to claim 7, wherein said electronic identification device is operatively connected to said RF modem through a control signal interface board.

13. The video display unit bracket according to claim 7, further comprising a control signal interface board that includes a plurality of peripheral device interfaces for communicating with a plurality of peripheral devices.

14. The video display unit bracket according to claim 13, wherein said plurality of peripheral devices comprises user interface control devices selected from the group consisting of a video display unit control, a keyboard control, a mouse control, and a game paddle control.

15. The video display unit support bracket of claim 7, further comprising a multiplexing device having means for multiplexing a power supply voltage and an RF signal containing video display data for said video display unit.

16. The video display unit support bracket of claim 15, wherein said multiplexing device further includes a voltage regulation circuit providing a regulated voltage output responsive to said power supply voltage.

17. A video display unit support bracket comprising:
    a rigid casing defining a first outer shell;
    an engagement structure disposed on a portion of said rigid casing, said engagement structure comprising at least one receiver configured for rotatably securing a proximal end of a video display unit support arm to said rigid casing, said receiver is comprised of an elongated aperture sized and shaped for receiving a pin disposed on an end of said support arm proximal to said rigid casing;
    a first internal cavity at least partially enclosed by said rigid casing;
    a multiplexing device disposed within said first internal cavity; and
    wherein said multiplexing device further comprises means for multiplexing a power supply voltage and an RF signal containing video display data for said video display unit.

18. The video display unit support bracket according to claim 17, wherein said elongated aperture contains a bushing configured for rotation of said pin.

19. The video display unit support bracket according to claim 17, wherein said multiplexing device further contains a voltage regulation circuit, said voltage regulation circuit providing a regulated voltage output responsive to said power supply voltage.

20. The video display unit support bracket according to claim 17, further comprising an electronic identification device that is operatively connected to an RF modem through a control signal interface board.

* * * * *